US006878633B2

United States Patent
Raskin et al.

(10) Patent No.: US 6,878,633 B2
(45) Date of Patent: Apr. 12, 2005

(54) FLIP-CHIP STRUCTURE AND METHOD FOR HIGH QUALITY INDUCTORS AND TRANSFORMERS

(75) Inventors: Glenn D. Raskin, Phoenix, AZ (US); George W. Marlin, Phoenix, AZ (US); Douglas G. Mitchell, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 84 days.

(21) Appl. No.: 10/329,081

(22) Filed: Dec. 23, 2002

(65) Prior Publication Data

US 2004/0121606 A1 Jun. 24, 2004

(51) Int. Cl.[7] .............................................. H01L 21/301
(52) U.S. Cl. ...................................... 438/694; 438/612
(58) Field of Search ................................ 438/612–615, 438/694, 700, 706, 723, 724; 257/779, 780

(56) References Cited

U.S. PATENT DOCUMENTS

| | | | |
|---|---|---|---|
| 5,478,773 A | | 12/1995 | Dow et al. |
| 5,541,135 A | | 7/1996 | Pfeifer et al. |
| 6,222,279 B1 | * | 4/2001 | Mis et al. ................... 257/779 |
| 6,372,622 B1 | * | 4/2002 | Tan et al. ................... 438/612 |
| 6,413,851 B1 | * | 7/2002 | Chow et al. ................ 438/613 |
| 6,429,531 B1 | * | 8/2002 | Mistry et al. ............... 257/780 |
| 6,501,185 B1 | * | 12/2002 | Chow et al. ................ 257/780 |
| 6,521,501 B1 | * | 2/2003 | Erhardt et al. ............. 438/305 |
| 6,586,322 B1 | * | 7/2003 | Chiu et al. .................. 438/612 |

* cited by examiner

Primary Examiner—Kin-Chan Chen (57) ABSTRACT

A structure and method for achieving a flip-chip semiconductor device having plated copper inductors (4), transformers (16), interconnect, and power busing that is electrically superior, lower cost, and provides for higher quality inductors as well as lower losses for on-chip transformers. Providing a solder dam (8, 24, 28) enables the fabrication of flip-chip solder bumps directly on to inductors and transformers.

11 Claims, 7 Drawing Sheets

FLIP-CHIP STRUCTURE AND METHOD FOR HIGH QUALITY INDUCTORS AND TRANSFORMERS

TECHNICAL FIELD OF THE INVENTION

The present invention relates to the field of semiconductors, and more particularly to a structure and method to fabricate high quality inductors and transformers using a flip-chip design.

BACKGROUND OF THE INVENTION

Flip-chip technology presents a potentially highly effective way of fabricating a packaged semiconductor. The flip-chip mounting technique eliminates the use of bond wires between a chip or chip package and the substrate, resulting in increased reliability of the chip-to-substrate bond. In a flip-chip design, solder bumps are fabricated directly onto the aluminum bonding pads of the microchip. In this configuration, the active face of the chip is mounted face down, or "flipped" on the substrate. These bumps are then bonded directly to the package, or substrate pads, by reflowing the solder bumps. All bumps are bonded at the same time.

Designing microchips with flip-chip technology has numerous advantages. These advantages include a reduction in interconnection lengths, a smaller package footprint, and a lower package profile compared with conventional wire bonding techniques. In addition, flip-chip bonding allows for bonding locations within the interior of the chip, instead of just at the chip perimeter. Consequently, chips that are made with a flip-chip design have more I/O capacity than those chips of an identical size that are made with a perimeter interconnect design. Also, the very short lengths of the chip-to-package interconnect paths minimizes their inductance.

The solder bumps are formed on the microchip while the microchip is still in wafer form. A wide range of electrically conducting compositions are known for making the interconnection between flip-chip and substrate bond pads. Solder bumps, gold bumps, gold stud bumps, and other conventional metal bump configurations are known to the art. Both lead based and lead free solders are used for solder bumps. Desirable solders melt at the relatively high temperature of 315 degrees Celsius, which permits other low-melting-point solders to be used at in subsequent module-to-card, or card-to-board packaging level processes without reflowing the flip-chip bonds. In addition, the art has developed electrically conducting polymer compositions for flip-chip interconnection bumps. In a flip-chip fabrication process using polymer materials, electrically conductive polymer bumps are formed on the bond pads, typically of the flip-chip, and are polymerized or dried during bonding to the substrate bond pads. This fabrication process forms both an electrical and a mechanical adhesive bond between the flip-chip and the substrate bond pads.

Conventionally, once a flip-chip is bonded to a substrate, whether by metallic or by polymer bump interconnections between the chip and substrate bond pads, an underfill material is dispensed between the chip and the substrate. The underfill material is typically provided as a liquid adhesive resin that can be dried or polymerized. The underfill material provides enhanced mechanical adhesion and mechanical and thermal stability between the flip-chip and the substrate, and inhibits environmental attack of chip and substrate surfaces.

Due to its numerous advantages, it is highly desirable to utilize flip-chip technology in connection with Radio Frequency (RF) circuits and systems. However, at the present time, flip-chip technology that has high quality connections with RF circuits with plated copper inductors and transformers is unknown to the art. For microchips with integrated inductors and transformers, an underlying layer of metal is used for redistribution in the thin metallization system. This redistribution results in excessive losses for RF applications, thereby inhibiting the use of flip-chip technology for RF designs. It is therefore desirable to develop a flip-chip process and design that can provide high quality integration of inductors and transformers.

BRIEF DESCRIPTION OF THE DRAWINGS

FIGS. 4–14 illustrate a preferred process of fabricating a flip-chip structure on either the inductor of FIG. 1 or 2, or the transformer of FIG. 3 in accordance with a preferred embodiment of the present invention.

DETAILED DESCRIPTION OF A PREFERRED EMBODIMENT

Figure 1:
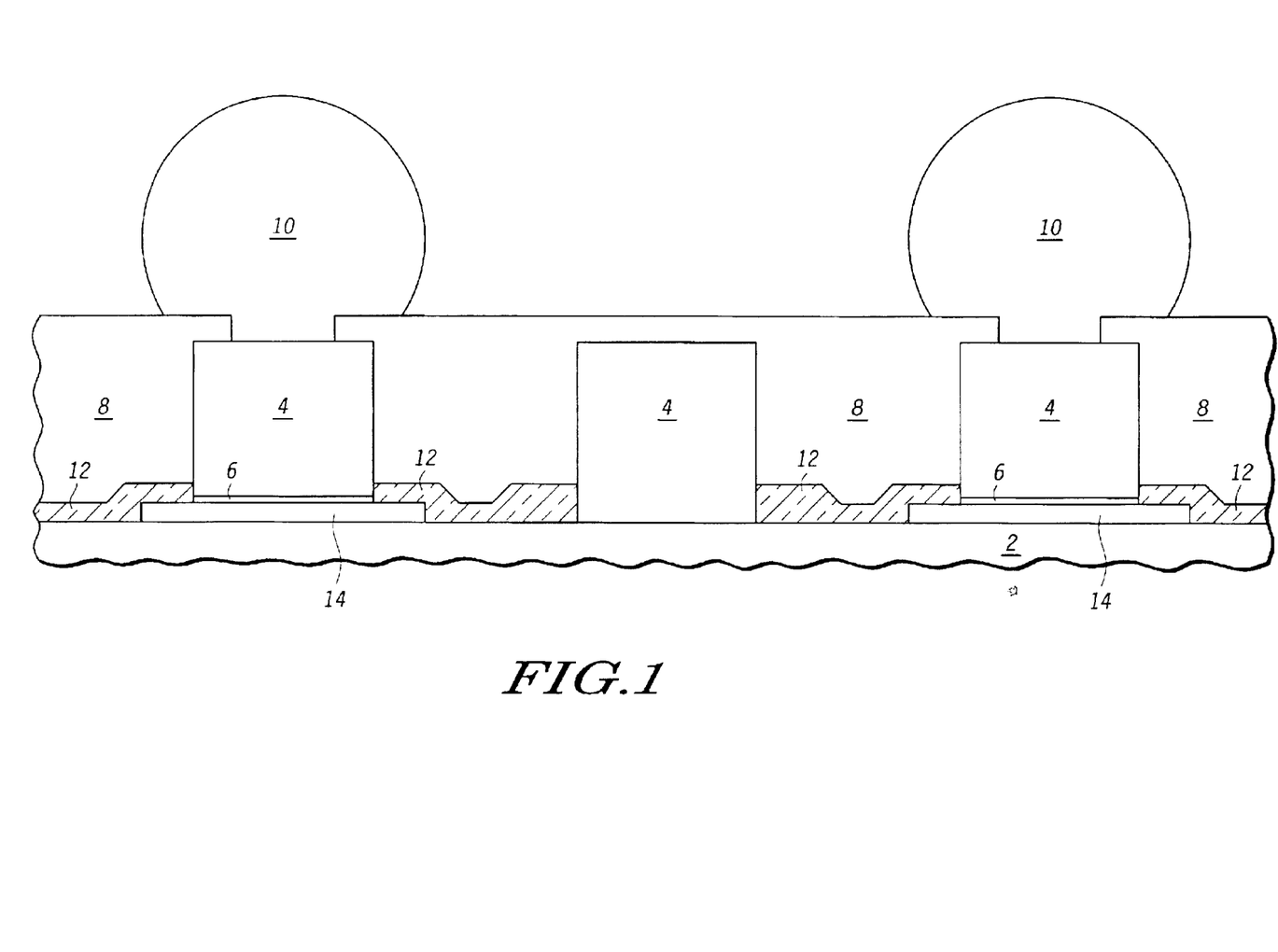
FIG. 1 illustrates a side view of a preferred embodiment of the present invention with an inductor.

Referring to the Figures by characters of reference, FIG. 1 illustrates a flip-chip structure for an inductor fabricated within a microchip in accordance with a preferred embodiment of the present invention. A wafer 2 is illustrated having an inductor 4 formed therein. Inductor 4 is typically formed from electroplated copper over a titanium/tungsten (TiW) seed layer 6. A region of dielectric material 8 is provided over wafer 2 and around inductor 4. Solder bumps 10 are formed directly to inductor 4 thereby forming the flip-chip structure. Solder bumps 10 are then bonded directly to a microchip package, or substrate pads, by reflowing the solder bumps 10 in a subsequent thermal process. All bumps 10 are bonded to the package or substrate pads at the same time.

Dielectric layer 8 serves a variety of functions. First, dielectric layer 8 serves to isolate inductor 4 and wafer 2 from exposure to corrosive moisture. Further, dielectric layer 8 provides mechanical stress relief within the overall packaged semiconductor. In a packaged semiconductor, a highly compressive mold compound is formed over wafer 2 on top of dielectric layer 8. This high stress from compressive mold compound can damage glass layer 12. Dielectric layer 8 functions to relieve the stress from compressive mold compound and protect glass layer 12. As a result, dielectric layer 8 functions to protect the integrity of the overall packaged semiconductor. Layer 8 also functions as stress relief in flip-chip applications where underfill is used between die and substrate. It is desirable to have good adhesion between the underfill and dielectric in such applications.

Dielectric layer 8 also protects inductor 4 from damage. During subsequent flip-chip processes, mechanical damage can occur to inductor 4. In addition, the highly compressive mold compound forming the packaged semiconductor protective case can mechanically damage inductor 4. Dielectric layer 8 forms a protective barrier around inductor 4 to shield against mechanical damage.

Dielectric layer 8 also functions as a solder dam in the flip-chip fabrication process. During a preferred process to fabricate a preferred flip-chip structure, dielectric layer 8 functions as a solder dam to contain the solder used to form solder bump 10 on inductor 4 during its fabrication. During formation of solder bump 10, a thermal process is used. In a thermal process, the solder forming solder bump 10 will flow along inductor 4 if it is not blocked or dammed in position in some manner. Dielectric layer 8, through forming a dam, prevents the solder forming solder bump 10 from running along copper inductor during the thermal processes used to form solder bump 10. Aluminum bond pads 14 are provided as the contact point between wafer 2 and inductor 4.

Figure 2:
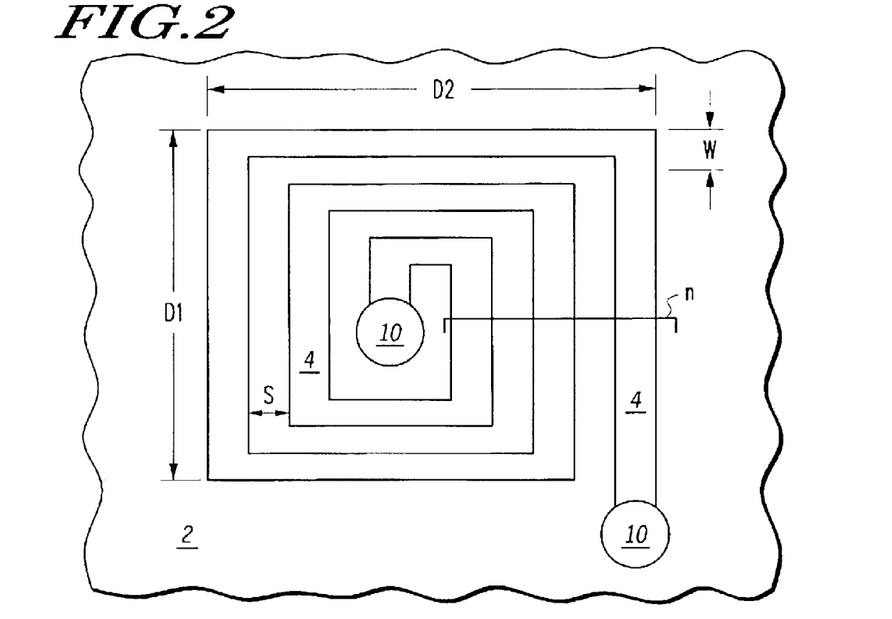
FIG. 2 illustrates a top view of a preferred embodiment of the present invention with an inductor.

FIG. 2 illustrates a top view of a flip-chip structure for an inductor 4 fabricated within a microchip in accordance with a preferred embodiment of the present invention. Inductor 4 is illustrated fabricated over wafer 2. Inductor 4 is formed in a spiral configuration. Spiral inductor 4 is commonly employed as a performance-limiting component in monolithic Radio-Frequency (RF) circuits, such as Voltage-Controlled Oscillators (VCO), Low-Noise Amplifiers (LNA), and passive element filters. The Quality factor (Q) of inductor 4 is limited by resistive losses in the spiral coil, substrate losses, and losses in the wires that connect inductor 4 to the remainder of the circuit. Preferably, inductor 4 is made of electroplated copper. Other materials such as gold or aluminum can form inductor 4. The lateral structure of inductor 4 is defined by the number of turns (n), the wire width (W), space (S), and total area covered (D1*D2).

Solder bumps 10 are formed on inductor 4 at the ends of inductor 4. Solder bumps electrically couple inductor 4 to the external package and to other components in the final application. Fabricating solder bumps 10 directly on inductor 4 provides numerous advantages. First, fabricating solder bumps 10 directly on inductor 4 is a compact design that reduces the amount of chip area used. This compact design allows for the reduction in the overall chip size, which reduces cost, or enables the fabrication of additional circuits and components. Further, fabricating solder bumps 10 directly to inductor 4 eliminates the use of wires to connect inductor 4 to contact points, thereby improving the quality factor of inductor 4. A further advantage with this design is that the compact design reduces power consumption, thereby improving battery life for portable electronic applications. In addition, the compact design reduces RF losses making it desirable to employ with wireless devices. Bumps 10 can also be used to transfer heat from the die to substrate.

Figure 3:
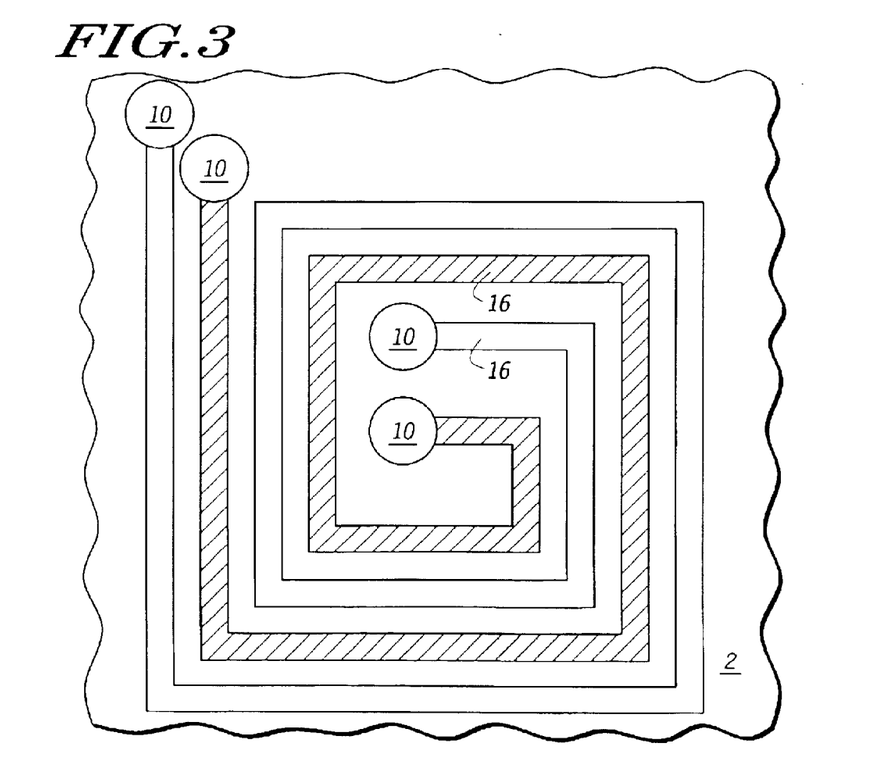
FIG. 3 illustrates a top view of a preferred embodiment of the present invention with a transformer.

FIG. 3 illustrates a top view of a transformer fabricated in accordance with a present preferred embodiment of the invention. Transformer 16 and solder bump 10 structure has a similar side view as inductor 4 shown in FIG. 1. Solder bumps 10 are formed on transformer 16 at the ends of transformer 16. Solder bumps 10 electrically couple transformer 16 to the external package or circuit. Through fabricating solder bumps 10 directly on transformer 16 provides numerous advantages. As with inductor 4, fabricating solder bumps 10 directly to inductor 4 eliminates the use of wires to connect inductor to contact points, thereby improving the quality factor and reducing losses. This flip-chip structure allows for a compact design that reduces power consumption. As a result, this solder bump 10 design is highly desirable to use with wireless devices.

Figure 4:
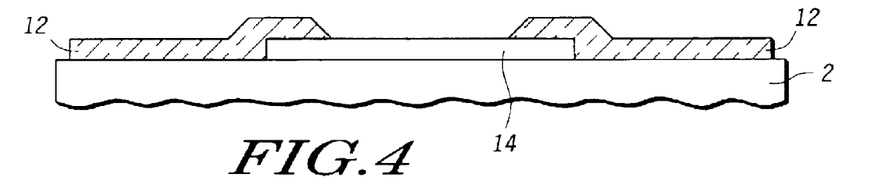
FIG. 4 illustrates a wafer at a preferred initial process step in a preferred present embodiment of the invention.

FIGS. 4–14 illustrate a preferred process of fabricating a flip-chip structure on either the inductor 4 of FIG. 1 or 2, or the transformer 16 of FIG. 3 in accordance with a preferred embodiment of the present invention. FIG. 4 illustrates a wafer 2 at an initial backend process step in a preferred present embodiment of the invention. At the stage of manufacture illustrated in FIG. 4, wafer 2 is fabricated with transistors formed therein and is prepared for reception of inductors 4, transformers 16, and flip-chip structures mounted thereon. In FIG. 4, a wafer 2 is illustrated having an aluminum bond pad 14 formed thereon. Aluminum bond pad 14 is the structure that forms the contact between wafer 2 and solder bump 10. A glass 12 is deposited on wafer 2 and aluminum bond pad 14. Glass 12 is provided to insulate and isolate wafer 2 and protect wafer 2 from mechanical damage the can occur in further fabrication processes. Exemplary materials for glass 12 include silicon dioxide and silicon nitride.

Figure 5:
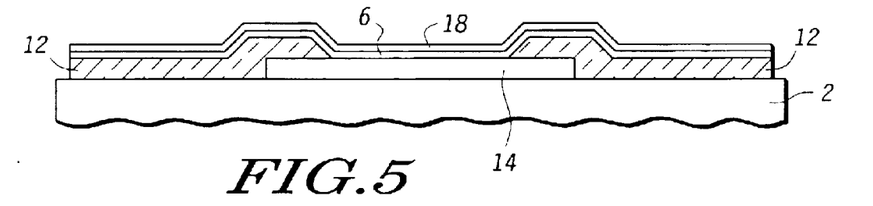
FIG. 5 illustrates the wafer at a preferred seed layer deposition fabrication step in a preferred present embodiment of the invention.

FIG. 5 illustrates wafer 2 at a preferred seed layer deposition fabrication step in a preferred present embodiment of the invention. As illustrated in FIG. 5, titanium/tungsten (TiW) seed layer 6 is deposited over glass 12 and aluminum bond pad 14. A copper seed layer 18 is then deposited over titanium/tungsten (TiW) seed layer 6. Seed layers 6 and 18 are provided as an initial step for electroplating copper material onto wafer 2 to form inductor 4, transformer 14, or a copper stud. Titanium/tungsten (TiW) and copper seed layers 6 and 8 are formed using either Chemical Vapor Deposition (CVD) or Plasma Vapor Deposition (PVD). Copper seed layer 18 functions as the cathode in the subsequent electroplating process. Titanium/tungsten (TiW) seed layer 6 is provided to supply good adhesion between copper seed layer 18 and aluminum bonding pad 14.

Figure 6:
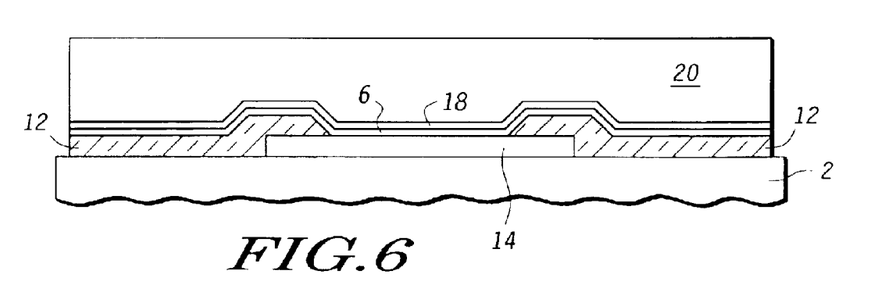
FIG. 6 illustrates the wafer at a photoresist fabrication step in a preferred present embodiment of the invention.

FIG. 6 illustrates wafer 2 at a photoresist fabrication step in a preferred present embodiment of the invention. A layer of photoresist 20 is applied as a thin film over copper seed layer 18. Photoresist layer 20 is exposed through a mask, or reticle in a step-and-repeat projection system. The mask contains clear and opaque features that define the pattern of inductor 4 or transformer 16 to be created in photoresist layer 20.

Figure 7:
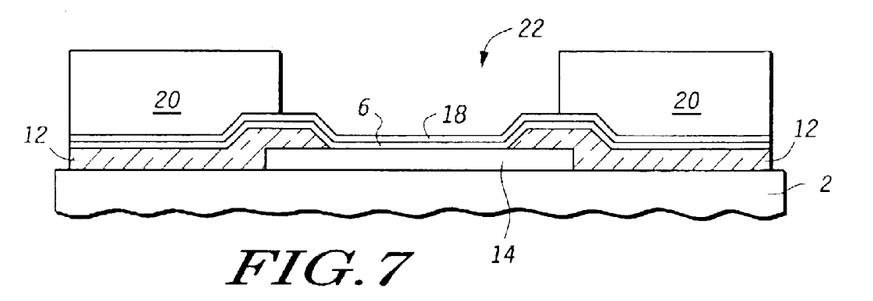
FIG. 7 illustrates the wafer at a exposure and develop photoresist fabrication step in a preferred present embodiment of the invention.

FIG. 7 illustrates wafer 2 at an exposure and develop photoresist fabrication step in a preferred present embodiment of the invention. The areas in photoresist layer 20 exposed to the light are made either soluable or insoluable in a specific solvent known as a developer. Following development, a window 22 is opened up in the form of inductor 4, transformer 16, or a stud. Window 22 is formed over copper seed layer 18 to facilitate electroplating of copper for inductor 4, transformer 16, or copper stud.

Figure 8:
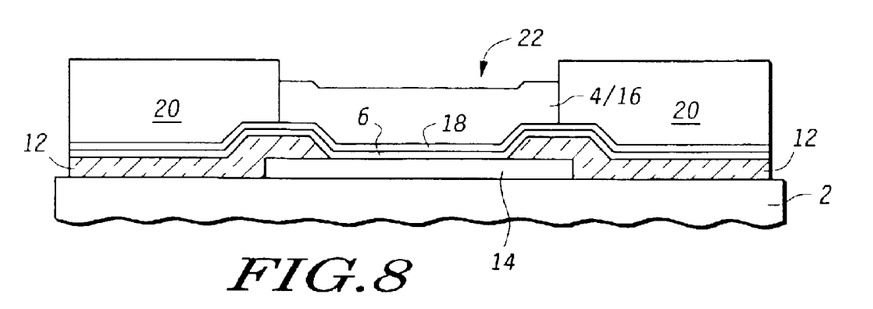
FIG. 8 illustrates the wafer at a plating fabrication step in a preferred present embodiment of the invention.

FIG. 8 illustrates wafer 2 at a plating fabrication step in a preferred present embodiment of the invention. An electroplating process is used to form inductor 4, transformer 16, or a copper stud for interconnect or power busing. For an inductor 4 or transformer 16, the portion shown in FIGS. 8–14 is an end that is interconnected with wafer 2 and solder bump 10. Typically, copper is used to form inductor 4, transformer 16, or stud. Unlike most semiconductor processes, electroplating takes place at atmospheric pressure, room temperature, and in the presence of an aqueous electrolyte. Copper seed layer 18 acts as the cathode in the electroplating process. A consumable copper anode at the other end of the cell chamber completes the circuit. The electrolyte is flowed over wafer 2. When an external voltage is applied across the anode and cathode, electroplating occurs. Cupric ions from the electrolyte are reduced at the cathode, consuming two electrons from the external circuit and copper plating takes place on copper seed layer 18. Copper dissolves into the electrolyte at the anode, oxidizing to cupric ions and liberating two electrons to the external circuit. The current in the external circuit is a direct measure of the copper deposition rate on wafer 2. Alternatively, instead of copper, it is possible to electroplate either gold or aluminum to form inductor 4, transformer 16, or copper stud. If gold is used, an additional layer of nickel-gold or nickel-chrome plating is provided as a seed layer for the solder for bump 10.

Figure 9:
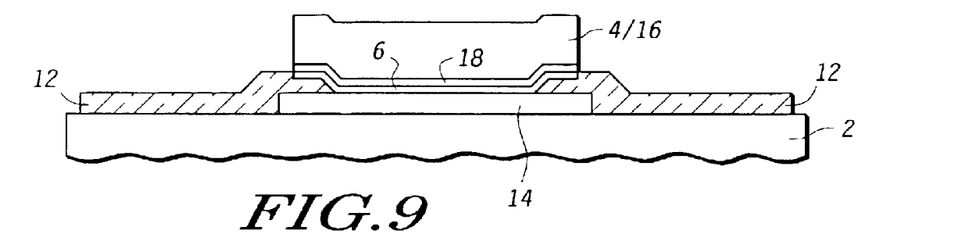
FIG. 9 illustrates the wafer at an etching fabrication step in a preferred present embodiment of the invention.

FIG. 9 illustrates wafer 2 at an etching fabrication step in a preferred present embodiment of the invention. After the electroplating process of FIG. 8, photoresist layer 20 is stripped off. An etching process is then used to etch copper seed layer 18 and titanium/tungsten (TiW) seed layer 6. This etching process removes all of copper seed layer 18 and titanium/tungsten (TiW) seed layer 6 that is not under inductor 4, transformer 16, or copper stud, thereby exposing glass 12.

Figure 10:
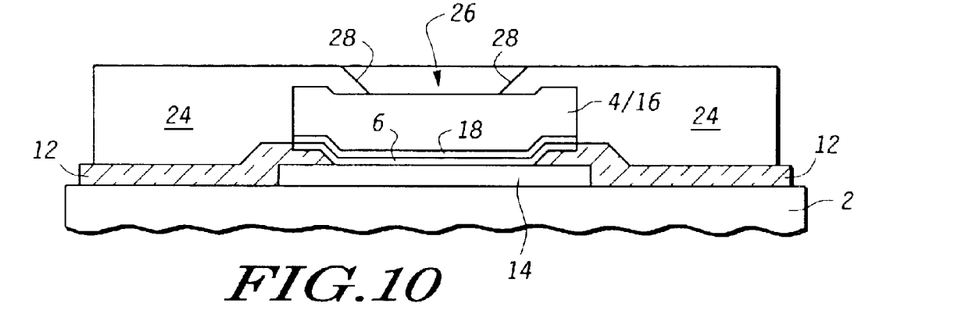
FIG. 10 illustrates the wafer at a deposition fabrication step in a preferred present embodiment of the invention.

FIG. 10 illustrates wafer 2 at a deposition fabrication step in a preferred present embodiment of the invention. In this step, dielectric material is deposited on wafer 2 to form a layer 24. Dielectric layer 24 forms a protective layer over wafer 2 and glass 12. Dielectric layer 24 protects inductor 4, transformer 16, or copper stud from corrosion by exposure to moisture in subsequent processing. In addition, dielectric 24 provides stress relief for glass 12. Glass 12 is vulnerable to cracking when placed under stress. Glass 12 is placed under stress when the highly compressive mold compound that forms the plastic package is deposited on wafer 2. In addition, dielectric layer 24 also protects inductor 4, transformer 16, or copper stud from mechanical damage that may occur in subsequent processing steps. Further, dielectric layer 24 forms a solder dam for solder bump 10. A preferred material for dielectric layer 24 is benzocyclobutene, or BCB. BCB is a photosensitive dielectric and is applied through a spin-on process. Further, BCB is inherently planarzing. As a result, structures such as dielectric layer that are made with BCB due not require a subsequent Chemical Mechanical Polishing step (CMP) to planarize dielectric layer 24. A subsequent photolithography process opens a hole 26 within dielectric layer 24 over a portion of inductor 4, transformer 16, or copper stud. Hole 26 is the point of contact for solder bump 10 with inductor 4, transformer 16, or copper stud. Hole 26 is formed having sloping side walls 28 through the use of a non-selective etching process. Dielectric layer 24 surrounding hole 26 provides the solder dam for solder bump 10. The sloping side walls 28 of dielectric layer 24 enable the formation of solder bump 10 into a sphere. However, it is not necessary to have sloping side walls 10 to form bump 10 into a sphere. Referring to FIG. 1, dielectric layer 8 is provided with vertical walls around bump 10 instead of side walls 28 illustrated in FIG. 10. Either sloped walls 28 or vertical side walls provide a spherical bump 10. Further, dielectric 24 forms passivation for inductor 4, transformer 16, or copper stud.

Figure 11:
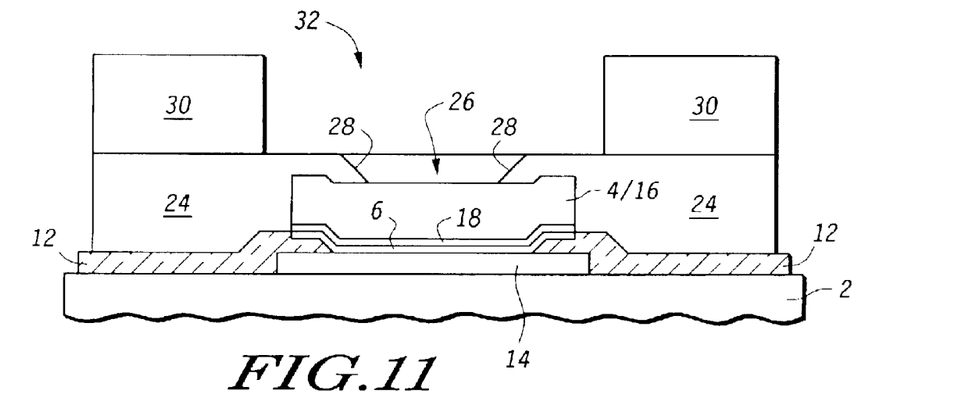
FIG. 11 illustrates the wafer where a solder mask laminate is applied in a preferred embodiment of the present embodiment of the invention.

FIG. 11 illustrates wafer 2 where a solder mask laminate 30 is applied in a preferred embodiment of the present embodiment of the invention. Solder mask laminate 30 is a photoresist compound, a dry laminate, or other solder masking material that is deposited over dielectric layer 24. A window 32 is opened in solder mask laminate 30 through a photolithographic process. The function of window 32 is to provide a region for depositing the material for solder bump 10. Window 32 is centered above hole 26 formed in dielectric layer 24. Together, window 32 and hole 26 function to provide a containment structure for formation of solder bump 10.

Figure 12:
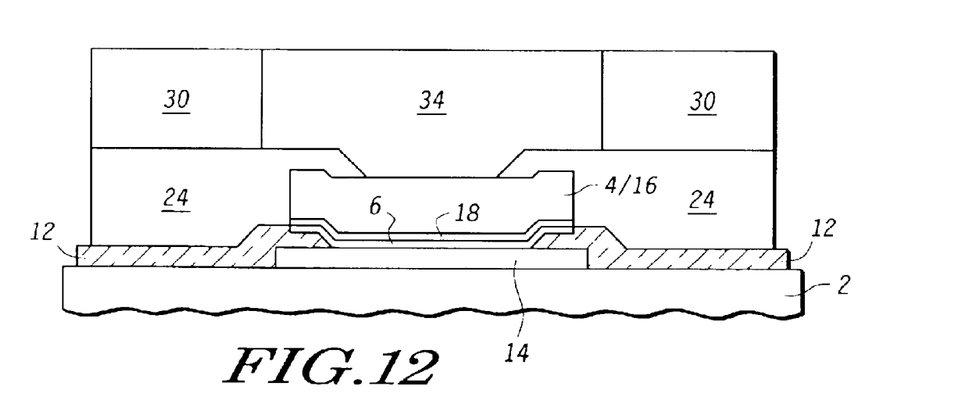
FIG. 12 illustrates the wafer at a squeegee application step in a preferred present embodiment of the invention.

FIG. 12 illustrates wafer 2 at a squeegee application step in a preferred present embodiment of the invention. The solder used to form solder bump 10 is applied to wafer 2 in a paste form. Solder paste 34 is placed into window 32 on wafer 2 through a conventional squeegee process. In this squeegee process, solder paste 34 is smeared onto solder mask laminate 30. Through this smearing process, solder paste 34 fills window 32 formed in dry laminate 30 as well has hole 26 formed in dielectric layer 24. A scraping tool removes the excess solder paste 34 from the top surface of solder mask laminate 30. Employing this squeegee process allows for the use of a variety of solder or lead free allows for the solder paste 34.

Figure 13:
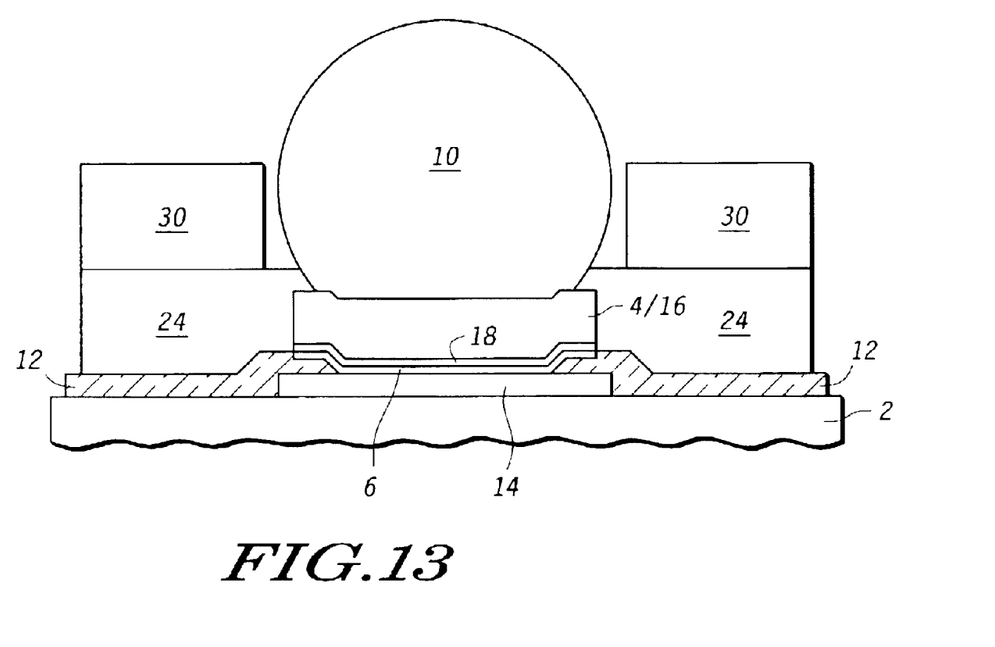
FIG. 13 illustrates the wafer with a reflow of a solder bump in a preferred present embodiment of the invention.

FIG. 13 illustrates wafer 2 with a reflow of solder bump 10 in a preferred present embodiment of the invention. In this step, wafer 2 and solder paste 34 are processed using a thermal process. The thermal process melts solder paste 34. The sloping walls 28 of hole 26 formed in dielectric layer 24 guides molten solder paste 34 to reflow into a spherical bump 10.

Figure 14:
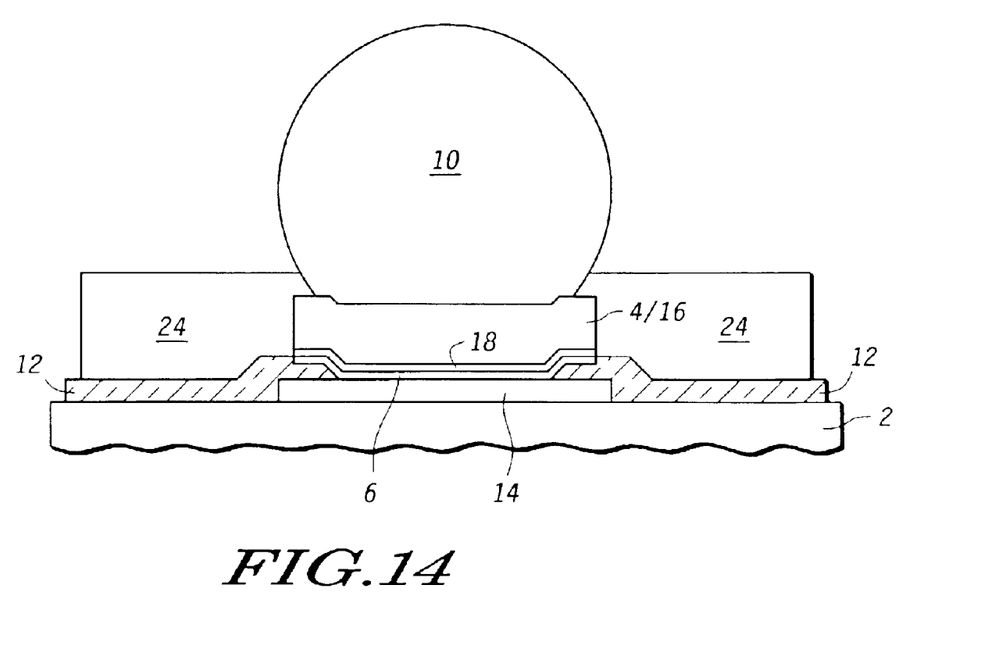
FIG. 14 illustrates the wafer with a strip and clean process in a preferred present embodiment of the invention.

FIG. 14 illustrates wafer 2 with a strip and clean process in a preferred present embodiment of the invention. A conventional photoresist stripping process is used to remove solder masking layer 30 from wafer. Depending upon the type of material used for solder masking layer 30, either an oxidizing-type (inorganic) stripper, organic stripper, or dry-type stripping technique is used. However, is a stencil print technique is used for bumps 10, such stripping is not necessary.

Figure 15:
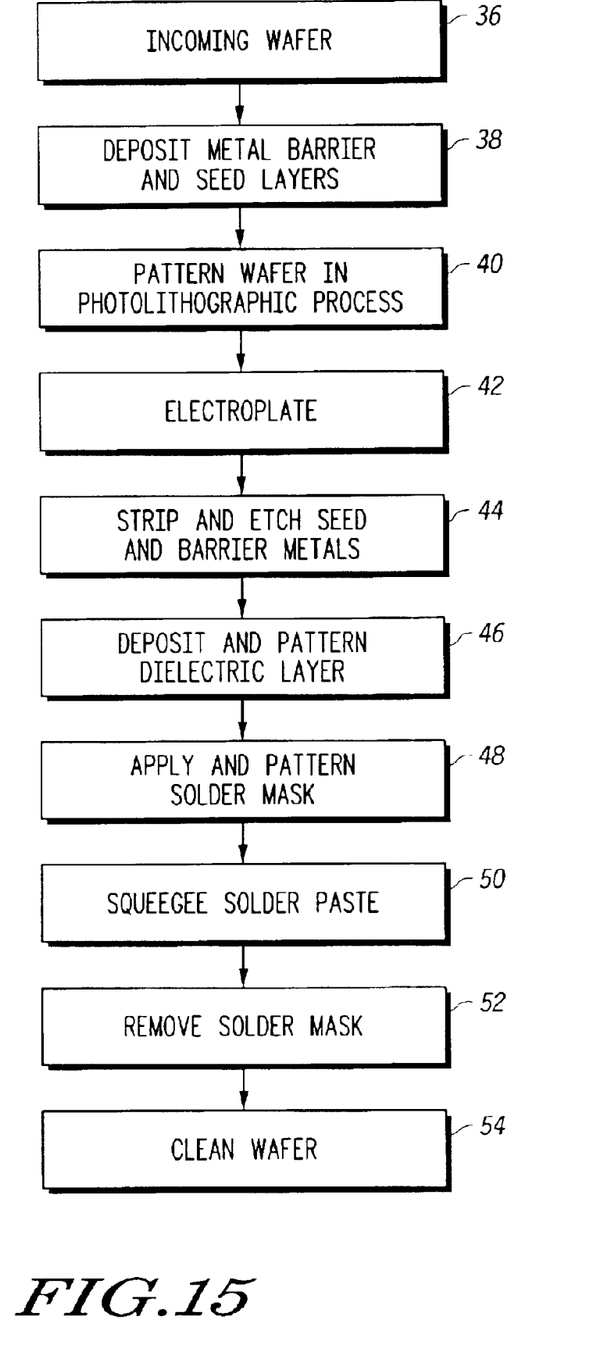
FIG. 15 illustrated a preferred process flow for a present embodiment of the invention.

FIG. 15 illustrates a flow chart of a preferred process flow for a present embodiment of the invention. At an initial step 36, an incoming wafer 2 that has an aluminum bond pad 14 and glass 12 covering thereon beings the backend flip-chip fabrication process. In step 38, copper and titanium/tungsten (TiW) seed layers 18 and 6 are deposited onto wafer 1. Titanium/tungsten (TiW) seed layer 6 provides a barrier and good adhesion between copper seed layer 18 and aluminum bond pad 14. Copper seed layer 18 serves as the cathode in the subsequent electroplating process that creates inductor 4, transformer 16, or copper stud. A photoresist process is performed in step 40 to open hole 26 where inductor 4, transformer 16, or copper stud is formed through electroplating in step 42.

In step 44, photoresist is stripped and an etching process removes titanium/tungsten (TiW) and copper seed layers 6 and 18 from wafer except from under plated inductor 4, transformer 16, or copper stud. In step 46, dielectric layer 24 is deposited and patterned to receive solder bump 10. A solder mask 30 is applied and patterned through a photoresist process in step 48. Solder mask 30 is patterned to open window 32 to fabricate solder bump 10. In step 50, solder paste 34 is squeegeed onto wafer 2 and into patterned window 32 and hole 26 formed over inductor 4, transformer 16, or copper stud.

Solder paste 34 is melted and reflowed into solder bump 10 through a thermal process in step 52. In step 54, solder mask 30 is stripped from wafer 2. Finally, wafer 2 is cleaned and readied for packaging in step 54. This manufacturing process has numerous advantages. First, through manufacturing solder bumps 10 directly to inductor 4, transformer 16, or copper stud eliminates several processing steps. As a result, this process is cost effective. In addition, each manufacturing step is an opportunity where defects can become incorporated in wafer 2 and the flip-chip structure. The elimination of processing steps creates an overall more reliable and defect free process. Also, various other solder alloys or lead free pastes can be used.

Note that solder bump 10 is the solder bump 10 that is the electrical contact of the flip-chip structure. These bumps 10 are then bonded directly to a package, or substrate pads, by reflowing the solder bumps 10 in an additional thermal process. All bumps 10 are bonded to the package or substrate pads at the same time.

Designing microchips with this flip-chip technology has numerous advantages. These advantages include a reduction in interconnection lengths, a smaller package footprint, and a lower package profile compared with conventional wire bonding techniques. In addition, this flip-chip bonding structure and method allows for bonding locations within the interior of chips having RF devices. Consequently, RF chips that are made with this flip-chip structure and method have more I/O capacity than those chips of an identical size that are made with a perimeter interconnect design. Also, the very short lengths of the chip-to-package interconnect paths minimizes their inductance. Consequently, for RF applications, this flip-chip design and fabrication process provides for high quality low loss RF circuits.

Figure 16:
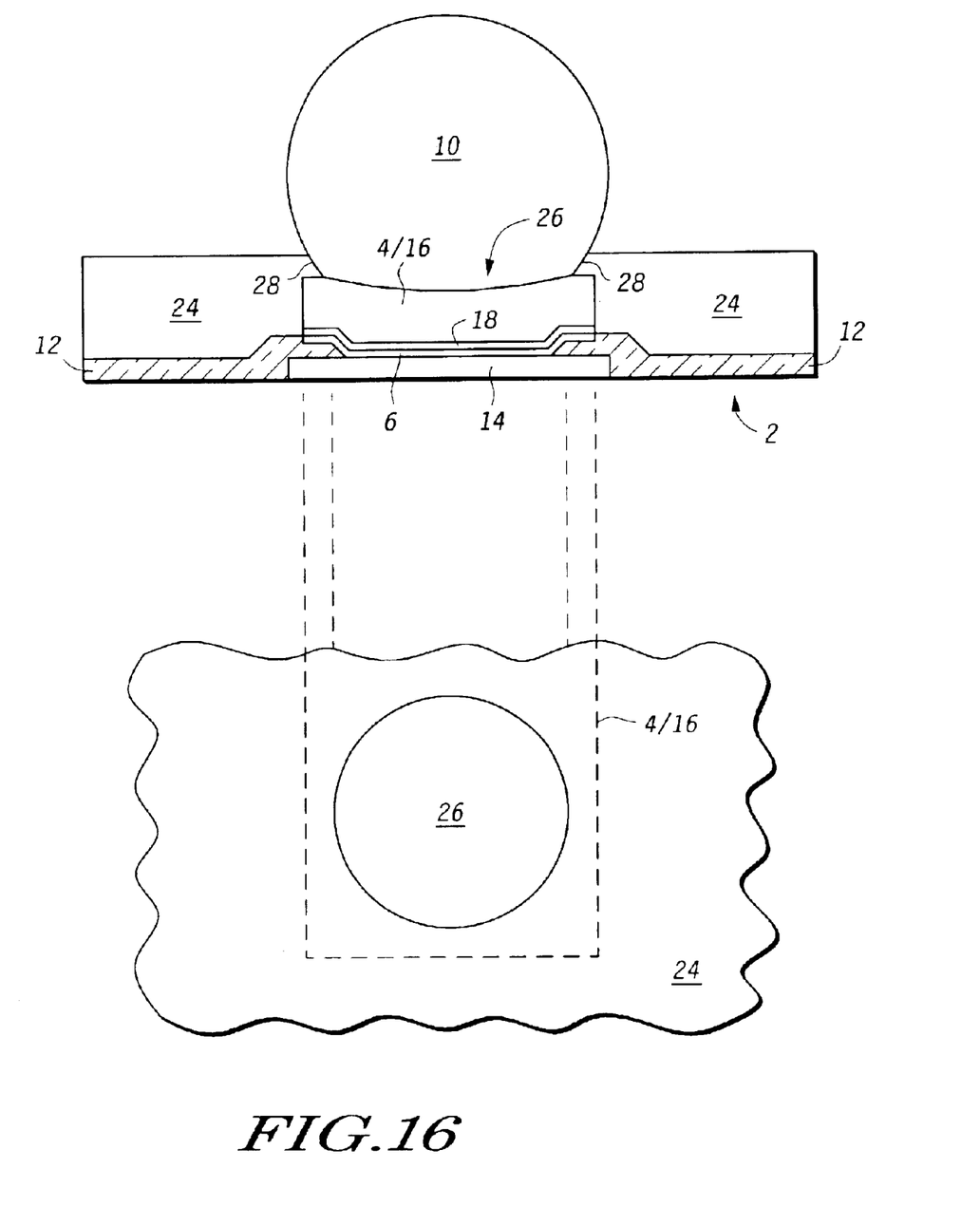
FIG. 16 illustrates a side and top view of a preferred solder bump fabricated in accordance with a present embodiment of the invention.

FIG. 16 illustrates a side and top view of a preferred solder bump 10 fabricated in accordance with a present embodiment of the invention. Solder bump 10 is formed from a conventional solder paste 34. These solder pastes can include lead free and lead based compounds. Solder bump 10 is directly copper inductor 4, transformer 16, or copper stud. Surrounding solder bump 10 is dielectric layer 24 formed preferably from BCB. The top view illustrates hole 26 formed in dielectric layer 24 to allow solder bump 10 to make direct contact with copper inductor 4, transformer 16, or copper stud. As illustrated in FIG. 12, solder paste 34 forming solder bump 10 is squeegeed into hole 26. During the reflow process illustrated in FIG. 13, wafer 2 and solder paste 34 undergoes a thermal process that melts solder paste into a liquid form. When solder paste 34 is in a liquid form, it flows along all metal paths that are in direct contact with the molten paste. Through providing dielectric layer 24 with hole 26, dielectric layer 24 forms a solder dam that constrains the flow of solder paste 34 when it is in its molten form. When solder paste 34 is in its molten form, it is held within hole by dielectric layer 24. Referring to the side view illustrating dielectric layer 24, dielectric layer 24 has sloped walls 28 formed along hole 26. Sloped walls 28 are created in the formation of hole 26 through the use of a non-selective etch. Sloped walls 28 provide structural guides to molten solder paste 34 to enable it to reflow into the shape of a bump 10. If dielectric layer 24 and hole 26 were not provided to form the solder dam, in the reflow process, molten solder paste 34 would run along the length of the heated inductor 4, transformer 16, or copper stud in the thermal process of FIG. 13 and not form into solder bump 10.

Dielectric layer 24 preferably covers the die surface of wafer 2 in order to seal and protect the die surface. Wafer 2 is covered with a highly compressive plastic mold compound to form the protective casing around wafer 2. Due to the fact that the plastic mold compound is highly compressive, stress is placed on glass 12. This stress can cause glass 12 to fracture leading to potential failure of wafer 2. In order to protect glass 12 from the stress caused by the highly compressive plastic covering, dielectric layer 24 is provided. Through forming dielectric layer 24 from BCB, the BCB serves as a layer of stress relief between the highly compressive plastic mold compound and the glass layer 12 or underfill in DCA applications. Further, again referring to the side and top views illustrated in FIG. 16, dielectric layer 24 surrounds solder bump 10 creating a hermetic seal around wafer 2, thereby protecting the wafer 2 from potential oxidation from the outside atmosphere.

In addition, referring to the top view of FIG. 16, inductor 4 or tranformer 16 is illustrated extending out from hole 26 under dielectric layer 24. Through providing hole 26 and dielectric layer 24 to act as a solder dam to guide solder paste 34 in the reflow process, solder paste 34 does not flow along inductor/transformer 4/16 in the thermal process.

Although the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

We claim:

1. A process for fabricating a flip-chip structure, comprising the steps of:

depositing a barrier metal seed layer onto a metal bond pad formed on a wafer;

depositing a copper seed layer on said barrier metal seed layer;

electroplating an RF component on said copper seed layer;

depositing a dielectric layer over said RF component;

patterning said dielectric layer to expose a portion of said RF component;

applying a solder mask over said dielectric layer;

patterning a window in said solder mask over said the exposed portion of said RF component;

applying a solder material into said window and down to the exposed portion of said RF component;

reflowing said solder material into a solder bump; and stripping said solder mask.

2. The process of claim 1, wherein said solder material is applied through a squeegee process.

3. The process of claim 2, wherein said solder material is a solder paste.

4. The process of claim 1, further comprising the step forming sloping side walls on the exposed portion of said dielectric layer.

5. The process of claim 4, wherein said sloping side walls are formed through a non-selective etch process.

6. The process of claim 1, further comprising the steps of:
depositing a photoresist layer over said copper seed layer;
patterning a component window in said photoresist layer to receive said RF component.

7. The process of claim 1, further comprising the step of etching the portions of said copper seed layer and said barrier metal seed layer not under said RF component off said wafer.

8. A process for forming a flip-chip solder bump on a wafer, comprising the steps of:
depositing a dielectric layer over an RF component formed on said wafer;
forming said dielectric layer into a solder dam through the steps of;
patterning said dielectric layer with a photolithographic process; and
performing a non-selective etch on said dielectric layer to form said solder dam with a sloped wall; and
applying a solder mask over said dielectric layer;
patterning said solder mask to form a window over said solder dam;
applying a solder paste to said wafer through a squeegee process;
reflowing said solder paste into said flip chip solder bump through a thermal process; and
stripping said solder mask.

9. The process of claim 8, further comprising the step of inhibiting the flow of said solder paste with said solder dam.

10. The process of claim 9, further comprising the step of forming said solder paste into a solder bump with said sloping side walls of said solder dam.

11. The process of claim 8, further comprising the step of sealing said wafer with said dielectric layer.

* * * * *